United States Patent
Mullner (10) Patent No.: US 9,819,287 B2
(45) Date of Patent: Nov. 14, 2017

(54) MAGNETIC SHAPE MEMORY ELEMENT LINEAR MOTOR SYSTEMS AND METHODS

(71) Applicant: BOISE STATE UNIVERSITY, Boise, ID (US)

(72) Inventor: Peter Mullner, Boise, ID (US)

(73) Assignee: BOISE STATE UNIVERSITY, Boise, ID (US)

( * ) Notice: Subject to any disclaimer, the term of this patent is extended or adjusted under 35 U.S.C. 154(b) by 413 days.

(21) Appl. No.: 14/681,947

(22) Filed: Apr. 8, 2015

(65) Prior Publication Data

US 2016/0301293 A1    Oct. 13, 2016

(51) Int. Cl.
*H02N 2/02* (2006.01)
*H01L 41/12* (2006.01)
*H02N 11/00* (2006.01)

(52) U.S. Cl.
CPC .......... *H02N 11/006* (2013.01); *H01L 41/12* (2013.01); *H02N 2/02* (2013.01)

(58) Field of Classification Search
CPC ....... H02K 41/00–41/065; H01L 41/00–41/47; H02N 2/02; H02N 11/006
USPC ............................ 310/300, 309, 12.01–12.33
See application file for complete search history.

(56) References Cited

U.S. PATENT DOCUMENTS

| | | | | |
|---|---|---|---|---|
| 2007/0236314 A1* | 10/2007 | Taya | .................. | F04B 9/06 335/220 |
| 2012/0161579 A1* | 6/2012 | Browne | .................. | F15B 15/10 310/330 |
| 2015/0115748 A1* | 4/2015 | Shimanouchi | ......... | H02N 2/186 310/26 |

* cited by examiner

*Primary Examiner* — Thomas Truong
(74) *Attorney, Agent, or Firm* — Parsons Behle & Latimer (57) ABSTRACT

A method of imparting motion includes contracting a portion of a magnetic shape memory (MSM) element in response to a magnetic field to form an indentation on a surface of the MSM element. The method further includes retaining a protrusion from a surface of a movable part at the indentation. The method also includes moving the movable part by changing a position of the indentation in response to a change in the magnetic field.

20 Claims, 5 Drawing Sheets

MAGNETIC SHAPE MEMORY ELEMENT LINEAR MOTOR SYSTEMS AND METHODS

FIELD OF THE DISCLOSURE

The present disclosure is generally related to a linear motor, and more particularly to a magnetic shape memory element linear motor.

BACKGROUND

Magnetic shape memory (MSM) alloys deform strongly when subjected to a variable magnetic field due to the principle of magnetic-field-induced strain (MFIS). MSM devices may rely on the deformation caused by the MFIS to perform particular functions (e.g., applying mechanical pressure, sealing a chamber, fluid pumping, other actuation functions, etc.).

Typical MSM devices will apply a magnetic field to an entire MSM element to produce the deformation. However, the extent to which an MSM element expands is limited. For example, the MFIS for a typical MSM device is about 6%. To illustrate, for a device with a 20 mm long MSM element, the stroke, or in other words, the amount by which the MSM element may be extended is about 1.2 mm. One potential problem associated with typical MSM devices is that for some applications, a required stroke may be longer than the MSM element alone can produce may be required.

Some MSM devices may rely on the deformation of a portion of an MSM element to pump fluids. Examples of such MSM devices are described further in U.S. patent application Ser. No. 14/493,674, filed on Sep. 23, 2014 and entitled "Electrically Driven Magnetic Shape Memory Apparatus and Method," and in U.S. patent application Ser. No. 13/550,386, filed on Jul. 16, 2012 and entitled, "Actuation Method and Apparatus, Micropump, and PCR Enhancement Methods," the contents of each of which are hereby incorporated by reference in their entireties. These devices may also be subject to the same stroke limitations. Other drawbacks of current MSM devices may exist.

SUMMARY

Accordingly, the present disclosure sets forth MSM element linear motor systems and methods that may solve, reduce, or eliminate at least one of the above-noted drawbacks of existing devices.

In an embodiment, an MSM element is used to move a rod along the MSM element through a channel. By using the MSM element to move a rod, where the rod may be used as an actuation element in contrast to using the MSM element as the actuation element, the stroke, or in other words, the reach of the MSM device may be extended. For example, for a device with a 20 mm long MSM element, the stroke may be more than 15 mm as compared to the 1.2 mm associated with typical MSM devices.

In an embodiment, a motor apparatus includes an MSM element. The apparatus further includes a magnetic field generator. The apparatus also includes a rod in contact with the magnetic shape memory element. The rod includes at least one protrusion from a surface of the rod. The protrusion is retained by an indentation on a surface of the MSM element.

In an embodiment, the magnetic field generator may include a permanent magnet. In another embodiment, the magnetic field generator may include a plurality of conductive coils. The apparatus may further include a magnetic yoke coupled to a first end and a second end of the MSM element and passing through each of the plurality of conductive coils. Each coil of the plurality of coils may wrap around the MSM element and the rod.

In an embodiment, the apparatus may further include a guide structure. The guide structure and the MSM element may define a channel that restricts shifting of the rod to one axis.

In an embodiment, the apparatus of may also include another MSM element. The rod may be positioned between the MSM element and the other MSM element. The rod may include a first set of protrusions from a first surface of the rod facing the MSM element and a second set of protrusions from a second surface of the rod facing the other MSM element. The first set of protrusions may be staggered along a longitudinal axis of the MSM element relative to the second set of protrusions.

In an embodiment, the apparatus includes at least one anchor coupled to the MSM element. The MSM element may include nickel, manganese, gallium, or any combinations thereof.

In an embodiment, a method of imparting motion includes contracting a portion of a magnetic shape memory (MSM) element in response to a magnetic field to form an indentation on a surface of the MSM element. The method further includes retaining a protrusion from a surface of a movable part at the indentation. The method also includes moving the movable part by changing a position of the indentation in response to a change in the magnetic field.

In an embodiment, the MSM element is configured to contract in response to a magnetic field component that is substantially perpendicular to a longitudinal axis of the MSM element. The method may further include rotating a permanent magnet to induce the change in the magnetic field. The permanent magnet may be configured to generate a magnetic field component that is substantially perpendicular to a longitudinal axis of the MSM element. Rotating the permanent magnet may reposition the magnetic field component relative to the MSM element.

In an embodiment, the method of claim 12 further includes reversing a direction of an electrical current in a conductive coil to induce the change in the magnetic field. The magnetic field may be generated by a plurality of conductive coils configured to generate a magnetic field component that is substantially perpendicular to a longitudinal axis of the MSM element. Reversing the direction of the electrical current in the conductive coil may reposition the magnetic field component relative to the MSM element. In an embodiment, the method may further include guiding the movable part linearly through a channel defined by the MSM element and a guide structure as the movable part is moved.

In an embodiment, the method may also include contracting additional portions of the MSM element to form additional indentations on the surface of the MSM in response to additional changes in the magnetic field. The method may include receiving additional protrusions from the surface of the movable part at the additional indentations. The method may further include continuously moving the movable part by continuously changing positions of the additional indentations in response to continuous changed in the magnetic field.

In an embodiment, the method may also include contracting a portion of another MSM element in response to the magnetic field to form an indentation on a surface of another MSM element. The method may include retaining another protrusion from another surface of the movable part at the indentation on the surface of the other MSM element. Moving the movable part may include changing a position of the indentation on the surface of the other MSM element in response to the change in the magnetic field.

The features, functions, and advantages that have been discussed can be achieved independently in various embodiments or may be combined in yet other embodiments further details of which can be seen with reference to the following description and drawings.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

Figure 1:
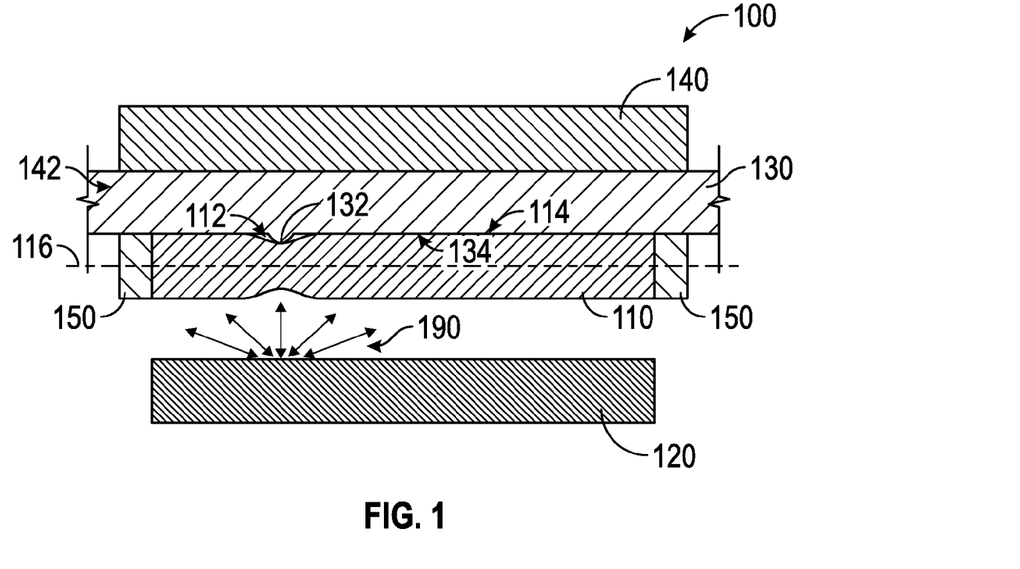
FIG. 1 is a cross-section diagram depicting an embodiment of an MSM element linear motor system in a first configuration.

Referring to FIG. 1, an embodiment of an MSM element linear motor system 100 in a first configuration is depicted. The system 100 includes an MSM element 110, a magnetic field generator 120, a rod 130, a guide structure 140, and one or more anchors 150.

The MSM element 110 may be elongated with a longitudinal axis 116 running substantially parallel to the rod 130. As used herein, being substantially parallel means that the longitudinal axis 116 is closer to being parallel to the rod 130 than to being perpendicular to the rod 130. The MSM element 110 may include materials such as nickel, manganese, gallium, another type of material, or combinations thereof. Further descriptions of the MSM element 110 may be found in U.S. patent application Ser. No. 13/550,386, filed on Jul. 16, 2012 and entitled, "Actuation Method and Apparatus, Micropump, and PCR Enhancement Methods," incorporated by reference above.

The MSM element 110 may be configured to contract locally at a portion of the MSM element 110 in response to local exposure to a magnetic field component 190 generated by magnetic field generator 120 and directed substantially perpendicularly to the longitudinal axis 116 of the MSM element 110. For example, the magnetic field component 190 may be substantially perpendicular to the longitudinal axis 116 causing an indentation 112 of the MSM element 110 to be formed within a surface 114 of the MSM element 110. As used herein, being substantially perpendicular means that the magnetic field component 190 is closer to being perpendicular to the longitudinal axis 116 than to being parallel to the longitudinal axis 116. The MSM element 110 may be further configured to uncontract locally at a portion of the MSM element 110 in response to the absence of exposure to the magnetic field component 190. For example, as depicted in FIG. 1, the MSM element 110 does not include indentations at portions that are not exposed to the magnetic field component 190. The MSM element 110 may further remain uncontracted locally in response to a magnetic field component that is directed as substantially parallel to the longitudinal axis 116 of the MSM element 110.

The magnetic field generator 120 may be positioned in proximity to the MSM element 110 such that the magnetic field component 190 generated by the magnetic field generator 120 is applied to the MSM element 110. At least a portion of the magnetic field component 190 may be perpendicular to the longitudinal axis 116 of the MSM element 110. The magnetic field component 190 may be changed by the magnetic field generator 120 such that a position of the substantially perpendicular portion is changed relative to the MSM element 110. The magnetic field generator 120 may include one or more permanent magnets, one or more conductive coils, one or more other instruments for generating a magnetic field, or combinations thereof as would be appreciated by one of ordinary skill in the art having the benefit of this disclosure. Particular embodiments of the magnetic field generator 120 are described further with reference to FIGS. 3-7.

The rod 130 may be positioned between the MSM element 110 and the guide structure 140 such that a surface 134 the rod 130 is held in contact with the surface 114 of the MSM element 110. Further, the rod 130 may include a protrusion 132. The protrusion 132 may be at a fixed position relative to the rod 130 such that when the protrusion 132 is moved, the rod 130 is moved with the protrusion 132. The protrusion 132 may be positioned at least partially inside the indentation 112 of the MSM element 110. In some embodiments, the rod 130 includes a low friction material to assist the rod 130 in sliding freely between the MSM element 110 and the guide structure 140. For example, the rod 130 may include materials such as plastics, metals, other low friction materials, or combinations thereof.

The guide structure 140 may be positioned in contact with the rod 130 opposite the MSM element 110. In an embodiment, the guide structure 140 encompasses the rod 130 in three directions such that the guide structure 140 and the MSM element 110 restrict shifting of the rod 130 to one axis along a channel 142 defined by the guide structure 140 and the MSM element 110. For example, movement of the rod 130 may be substantially restricted within FIG. 1 to shifting left or shifting right as guided by the guide structure 140. The guide structure 140 may include any material sufficient to retain the rod 130. For example, the guide structure 140 may include materials such as plastics, metals, other materials sufficient to retain and guide the rod 110, or combinations thereof.

The one or more anchors 150 may be positioned on either end of the MSM element 110 to retain the MSM element 110. For example, the one or more anchors 150 may prevent the MSM element 110 from shifting relative to the magnetic field generator 120 or the guide structure 140. As such, the one or more anchors 150 may be coupled to the magnetic field generator 120, the guide structure 140, or both. Further, although FIG. 1 depicts two anchors 150, the system 100 may include more or fewer than two anchors 150. For example, the system 100 may include one anchor 150 coupled to the MSM element 110 on one end. Also, in some embodiments, the one or more anchors 150 may make up part of and be included within the guide structure 140, such that the system 100 does not include distinct anchors 150.

During operation, the magnetic field generator 120 may generate the magnetic field component 190 such that a portion of the magnetic field 190 is substantially perpendicular to the longitudinal axis 116 of the MSM element 110. A portion of the MSM element 110 may contract in response to the magnetic field 190 to form the indentation 112 on the surface 114 of the MSM element 110. Thereafter, the magnetic field generator 120 may change the magnetic field component 190 so as to alter a position of the substantially perpendicular portion. As the position of the substantially perpendicular portion of the magnetic field component 190 changes, a position of the indentation 112 may also change because the MSM element 110 may contract at the new position of the substantially perpendicular portion and may uncontract at the previous position after the magnetic field 190 has passed. The indentation 112 may retain the protrusion 132 as it moves in response to the changing magnetic field 190, thereby causing the rod 130 to move.

Figure 2:
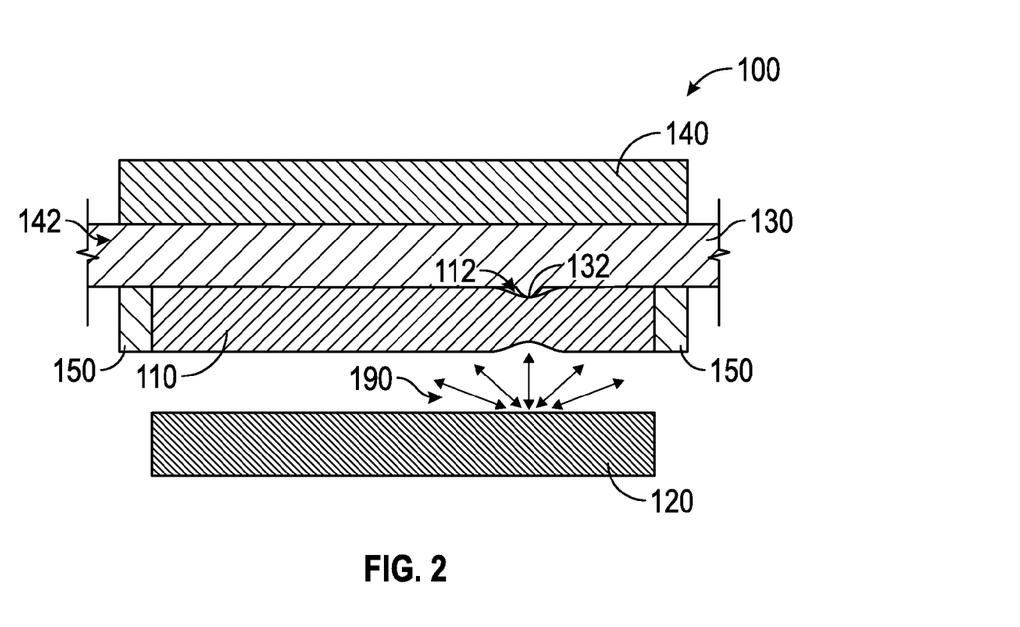
FIG. 2 is a cross-section diagram depicting the embodiment of the MSM element linear motor system of FIG. 1 in a second configuration.

Referring to FIG. 2, the embodiment of the MSM element linear motor system 100 is depicted in a second configuration after the magnetic field component 190 has changed. For example, as depicted in FIG. 2, the portion of the magnetic field component 190 that is substantially perpendicular to the longitudinal axis of the MSM element 110 has moved to the right with respect to the MSM element 110. Likewise, the indentation 112 has moved to the right. The protrusion 132, being retained by the indentation 112, has also moved to the right, thereby causing the rod 130 to be moved to the right as well. As will be appreciated by persons skilled in the art having the benefit of this disclosure, the operations of the system 100 may be reversed and the rod 130 may be moved from right to left by changing a position of the magnetic field 190 from right to left.

A benefit associated with the system 100 is that, by moving the rod 130 using the MSM element 110, the system 100 may be associated with a longer stroke (e.g., a longer reach) as compared to systems that do not include the rod 130. For example, the rod 130 may be able to extend further from the system 100 than the MSM element 110 could do alone in the presence of an expansion causing magnetic field. Other benefits and advantages associated with the system 100 will be apparent to those of skill in the art having the benefit of this disclosure.

Figure 3:
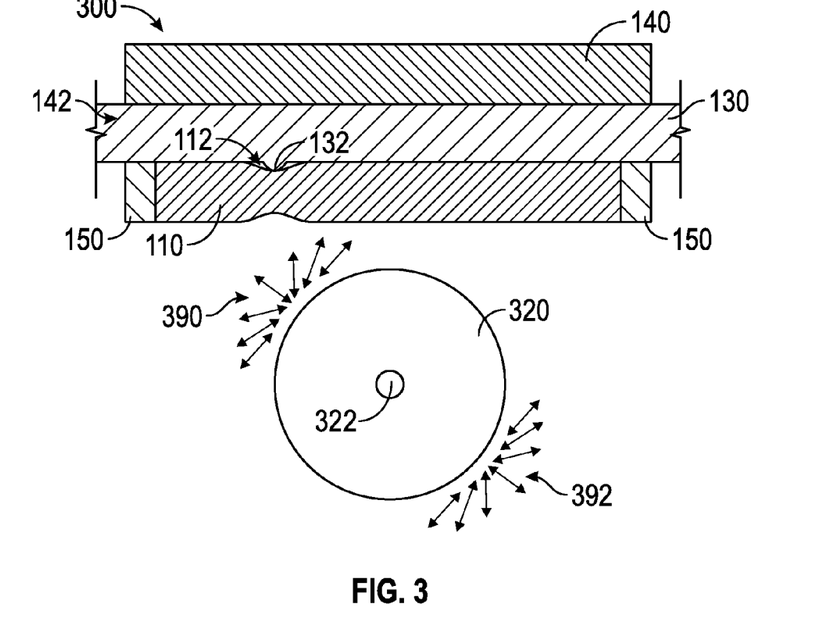
FIG. 3 is a cross-section diagram depicting an embodiment of an MSM element linear motor system in a first configuration.

Referring to FIG. 3, an embodiment of a magnetic shape memory (MSM) element linear motor system 300 in a first configuration is depicted. As depicted in FIG. 3, the magnetic field generator 120 may correspond to a permanent magnet 320. The permanent magnet 320 may be configured to generate a first magnetic field component 390 and a second magnetic field component 392. Further, the permanent magnet 320 may be rotatable around an axis 322. As depicted in FIG. 3, while in the first configuration, a portion of the magnetic field component 390 may be substantially perpendicular to the longitudinal axis 116 of the MSM element 110.

In an embodiment, the permanent magnet 320 is constructed by coupling one or more smaller magnets. By constructing the permanent magnet 320 in this way, the magnetic field components 390, 392 generated by the permanent magnet 320 may be designed such that regardless of how the permanent magnet 320 is turned relative to the MSM element 110, only a narrow portion of the resulting magnetic field proximate to the MSM element 110 may be substantially perpendicular to its longitudinal axis 116. In some embodiments, the permanent magnet 320 may generate more or fewer than two magnetic field components.

During operation, the permanent magnet 320 may be rotated to change positions of the magnetic field component 390 and the magnetic field component 392. For example, the permanent magnet 320 may be rotated clockwise. As the permanent magnet 320 rotates, different portions of the magnetic field component 390 or the magnetic field component 392 may be substantially perpendicular to the longitudinal axis 116 of the MSM element 110. The indentation 112 may move along the surface 114 of the MSM element 110 as the substantially perpendicular portions of the magnetic field components 390, 392 change position relative to the MSM element 110. As explained herein, changing a position of the indentation 110 may move the rod 130 with respect to the MSM element 110.

Figure 4:
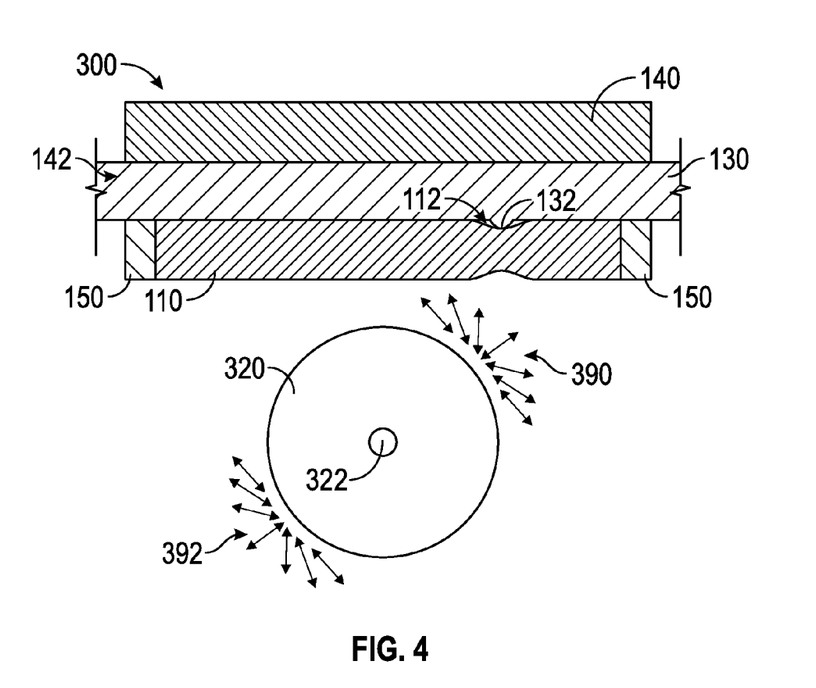
FIG. 4 is a cross-section diagram depicting an embodiment of the MSM element linear motor system of FIG. 3 in a second configuration.

Referring to FIG. 4, the embodiment of the MSM element linear motor system 300 is depicted in a second configuration after the permanent magnetic 320 has been rotated clockwise. For example, as depicted in FIG. 4, the portion of the magnetic field 390 that is substantially perpendicular to the longitudinal axis of the MSM element 110 has moved to the right with respect to the MSM element 110. Likewise, the indentation 112 has moved to the right. The protrusion 132, being retained by the indentation 112, has also moved to the right, thereby causing the rod 130 to be moved to the right.

As will be appreciated by persons skilled in the art, having the benefit of this disclosure, the operations of the system 300 may be reversed and the rod 130 may be moved from right to left by rotating the permanent magnet 320 counterclockwise instead of clockwise. Further, the permanent magnet 320 may be continuously rotated to generate additional indentations at the surface 114 of the MSM element 110. For example, after the indentation 112 has moved from left to right to place the system 300 in the second configuration, the permanent magnet 320 may continue to rotate such that a portion of the magnetic field 392 becomes proximate to and substantially perpendicular to the MSM element 110, thereby inducing an additional indentation at the left on the surface 114 of the MSM element 110. Additional protrusions may be received at the rod 130 to continuously move the rod 130, as described further with reference to FIG. 9.

A benefit of the system 300 is that by including the permanent magnet 320 as a magnetic field generator, the magnetic field components 390, 392 generate by the permanent magnet 320 may be changed simply by rotating the permanent magnet 320 as opposed to system that use other means to generate and change a magnetic field component. Other benefits and advantages associated with the system 300 will be apparent to those of skill in the art having the benefit of this disclosure.

Figure 5:
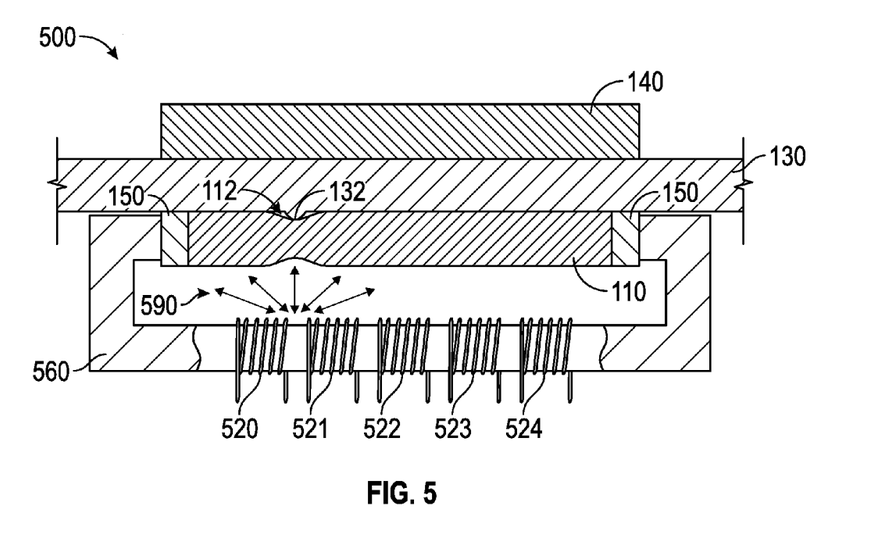
FIG. 5 is a cross-section diagram depicting an embodiment of an MSM element linear motor system in a first configuration.

Referring to FIG. 5, an embodiment of an MSM element linear motor system 500 in a first configuration is depicted.

As depicted in FIG. 5, the magnetic field generator 120 may include a plurality of conductive coils 520-524 and a magnetic yoke 560. It should be noted that while FIG. 5 depicts most of the system 500 as a cross section, the portion of the yoke 560 near the conductive coils 520-524 is not depicted in cross section, but rather depicts the full yoke with the conductive coils 520-524 wrapped thereon.

The plurality of conductive coils 520-524 may be configured to generate a magnetic field component 590. For example, electrical current may be applied to the coil 520 in a first direction and orientation. Additional electrical current may be applied to the coils 521-524 in a second direction or orientation. As such, the coil 520 and the coils 521-524 may generate opposing magnetic field components that result in a compressed magnetic field component between the coil 520 and the coils 521-524. The compressed magnetic field component may result in the magnetic field 590 that includes a portion that is substantially perpendicular to the longitudinal axis 116 of the MSM element 110.

The magnetic yoke 560 may enhance the magnetic field component 590 by completing a magnetic loop between the MSM element 110 and the conductive coils 520-524. For example, the magnetic yoke 560 may be coupled to the anchors 150 which are, in turn, coupled to a first end and a second end of the MSM element 110. The magnetic yoke 560 may further pass through each of the conductive coils 520-524. By enhancing the magnetic field 590, the effectiveness of the coils 520-524 may be enhanced. Although FIG. 5 depicts the system 500 as including the magnetic yoke 560, in other embodiments, the system 500 may exclude the magnetic yoke 560. Further, even though FIG. 5 depicts the magnetic yoke 560 as coupled to the anchors 150, in some embodiments, the magnetic yoke 560 may be coupled directly to the MSM element 110.

During operation, the magnetic field 590 may be changed by reversing a direction of the electrical current through one or more of the conductive coils 520-524. For example, the current through the conductive coil 521 may be reversed. By reversing the current through the conductive coil 521, the compressed magnetic field component may be moved to a new position between the conductive coil 521 and the conductive coil 522. The current in each of the coils 521-523 may be sequentially reversed to move the portion of the magnetic field component 590 that is substantially perpendicular to the longitudinal axis 116 of the MSM element 110.

Figure 6:
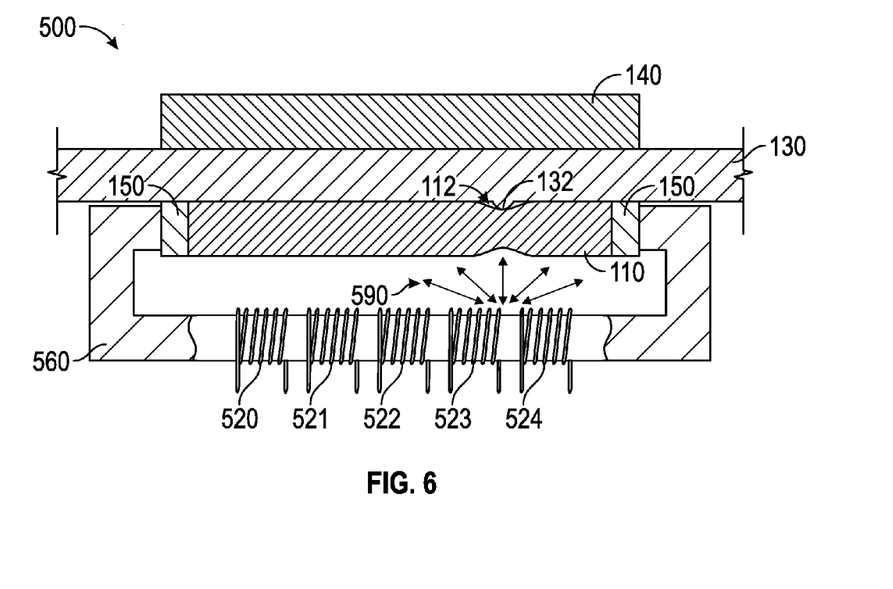
FIG. 6 is a cross-section diagram depicting an embodiment of the MSM element linear motor system of FIG. 5 in a second configuration.

Referring to FIG. 6, the embodiment of the MSM element linear motor system 500 is depicted in a second configuration after the electrical currents through each of the conductive coils 521-523 has been reversed. For example, as depicted in FIG. 6, the portion of the magnetic field component 590 that is substantially perpendicular to the longitudinal axis 116 of the MSM element 110 is moved to the right with respect to the MSM element 110. Likewise, the indentation 112 is moved to the right. The protrusion 132, being retained by the indentation 112, is also moved to the right, thereby causing the rod 130 to be moved to the right.

As will be appreciated by persons skilled in the art, having the benefit of this disclosure, the operations of the system 500 may be reversed and the rod 130 may be moved from right to left. Further, although FIGS. 5 and 6 depict the system 500 as including five conductive coils, in some embodiments the system 500 may include more or fewer than five conductive coils. Further descriptions of an MSM element actuation device using a plurality of conductive coils are included in U.S. patent application Ser. No. 14/493,674, filed on Sep. 23, 2014 and entitled "Electrically Driven Magnetic Shape Memory Apparatus and Method," the contents of which are hereby incorporated by reference in their entirety.

A benefit of the system 500 is that by including the plurality of conductive coils 520-524 as a magnetic field generator, the magnetic field 590 generated by the conductive coils 520-524 may be changed simply by changing a direction of a current through one or more of the conductive coils 520-524 as opposed to system that use other means (e.g., a permanent magnet) to generate and change a magnetic field. Further, the system 500 may be much smaller as compared to systems that use a permanent magnet. Other benefits and advantages associated with the system 500 will be apparent to those of skill in the art having the benefit of this disclosure.

Figure 7:
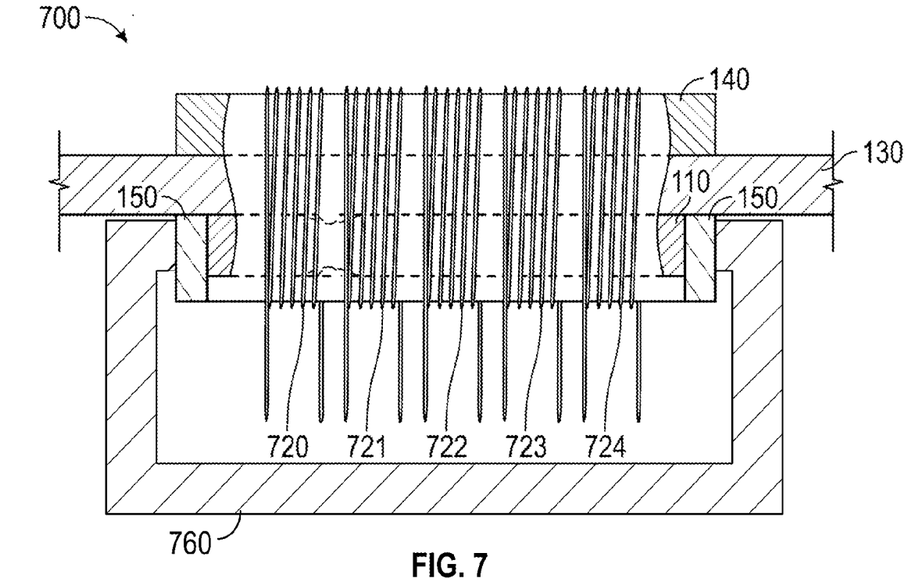
FIG. 7 is a cross-section diagram depicting an embodiment of an MSM element linear motor system.

Referring to FIG. 7, an embodiment of an MSM element linear motor system 700 is depicted. The system 700 may include a plurality of coils 720-724 and a magnetic yok 760. As depicted in FIG. 7, the plurality of coils 720-724 may wrap around the MSM element 110 and the rod 130. The conductive coils 720-724 may further wrap around the guide structure 140. During operation, the rod 130 may be moved by sequentially reversing an electrical current through the coils 721-723 as described with reference to FIGS. 5 and 6. Although FIG. 7 depicts the system 700 as including the magnetic yoke 760, in other embodiments, the system 700 may exclude the magnetic yoke 760. Further, even though FIG. 7 depicts the magnetic yoke 760 as coupled to the anchors 150, in some embodiments, the magnetic yoke 760 may be coupled directly to the MSM element 110. Further, although FIG. 7 depicts the system 700 as including one MSM element 110 and one magnetic yoke 760, in other embodiments, the system 700 may include a plurality of MSM elements and/or a plurality of magnetic yokes.

A benefit of the system 700 is that by wrapping the plurality of conductive coils 720-724 around the MSM element 110, the magnetic field that drives the change of position within the MSM element 110 is contained within a loop defined by the coils 720-724. As such, the system 700 may receive less interference from external magnetic fields as compared to system that do not include conductive coils wrapped around the MSM element 110. Further a benefit of wrapping the conductive coils 720-724 around the MSM element 110 is that this simplifies the assembly of the system 700 and this may permit building the system 700 at smaller scale. Other benefits and advantages associated with the system 500 will be apparent to those of skill in the art having the benefit of this disclosure.

Figure 8:
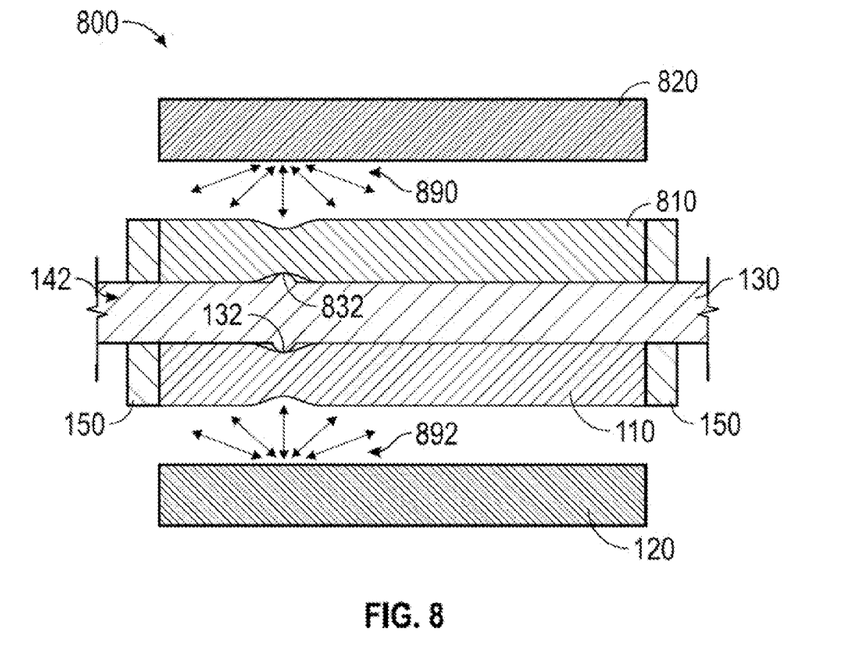
FIG. 8 is a cross-section diagram depicting an embodiment of an MSM element linear motor system.

Referring to FIG. 8, an embodiment of an MSM element linear motor system 800 is depicted. The system 800 may include a first MSM element 110, a first magnetic field generator 120, a rod 130, a second MSM element 810, and a second magnetic field generator 820.

The second MSM element 810 may be positioned in contact with the rod 130 opposite the first MSM element 110. Similar to the first MSM element 110, the second MSM element 810 may be configured to contract locally at a portion of the second MSM element 810 in response to local exposure to a magnetic field component directed substantially perpendicularly to a longitudinal axis of the second MSM element 810. For example, at least a portion of a magnetic field component 890 may be substantially perpendicular to the second MSM element 810 causing an indentation of the second MSM element 810 to be formed. The second MSM element 810 may be further configured to uncontract locally at a portion of the second MSM element 810 in response to the absence of exposure to a substantially perpendicular magnetic field component.

The second magnetic field generator 820 may generate the magnetic field component 890 and may be positioned in proximity to the second MSM element 810 such that the magnetic field component 890 generated by the second magnetic field generator 820 is applied to the MSM element 810. At least a portion of the magnetic field component 890 may be perpendicular to the second MSM element 810. The magnetic field component 890 may be changed by the magnetic field generator 820 such that a position of the substantially perpendicular portion is changed relative to the second MSM element 810. The magnetic field generator 820 may include one or more permanent magnets, one or more conductive coils, one or more other instruments for generating a magnetic field, or combinations thereof, as described herein.

In the embodiment of FIG. 8, the rod 130 may include a second protrusion 832 in addition to the protrusion 132. The first protrusion 132 may protrude from a first surface of the rod 130 and may be received within an indentation at the first MSM element 110. The second protrusion 832 may protrude from a second surface of the MSM element 110 and may be received within an indentation at the second MSM element 810. Although not depicted in FIG. 8, in some embodiments the rod 130 may include a first set of protrusions (i.e., one or more) protrusions and a second set of protrusions. For example, the first protrusion 132 may correspond to the first set of protrusions and the second protrusion 832 may correspond to the second set of protrusions. An embodiment that includes sets of protrusions is described further herein.

Although not depicted in FIG. 8, as will be appreciated by persons skilled in the art, having the benefit of this disclosure, the system 800 may further include a magnetic yoke or a plurality of magnetic yokes which may increase the magnetic field components 890 and 892 and may reduce other magnetic field components.

During operation, the first MSM element 110 and the first magnetic field generator 120 may operate as described herein using a first magnetic field component 892. The second magnetic field generator 820 may generate the second magnetic field 890 such that a portion of the second magnetic field component 890 is substantially perpendicular to the second MSM element 810. A portion of the second MSM element 810 may contract in response to the magnetic field component 890 to form an indentation. Thereafter, the second magnetic field generator 820 may change the magnetic field component 890 so as to alter a position of the substantially perpendicular portion. As the position of the substantially perpendicular portion of the magnetic field component 890 changes, a position of the indentation may also change because the MSM element 810 may contract at the new position of the magnetic field component 890 and may uncontract at the previous position after the magnetic field component 890 has passed. Because the indentation retains the second protrusion 832 of the rod 130, as the position of the indentation is changed, the rod 130 may move along with the indentation 112. As such, both the first MSM element 110 and the second MSM element 810 may apply force to the rod 130 simultaneously.

A benefit associated with the system 800 is that more force may be applied, or more consistently applied, to the rod 130 as compared to systems that do not include more than one MSM element. Further, although FIG. 8 depicts two MSM elements, in some embodiments, the system 800 may further include additional MSM elements and additional magnetic field generators to add further power and stability to the system 800. Other benefits and advantages associated with the system 800 will be apparent to those of skill in the art having the benefit of this disclosure.

Figure 9:
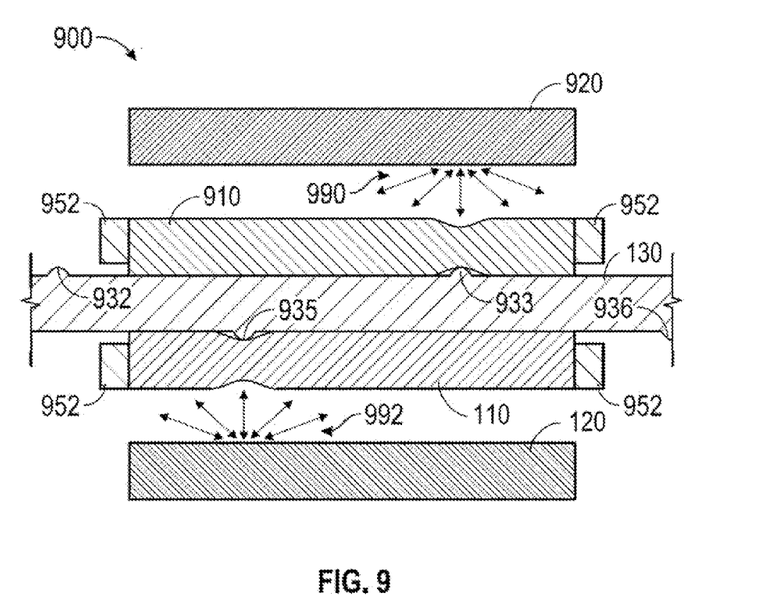
FIG. 9 is a cross-section diagram depicting an embodiment of an MSM element linear motor system.

Referring to FIG. 9, an embodiment of an MSM element linear motor system 900 is depicted. The system 900 may include the first MSM element 110, the first magnetic field generator 120, and the rod 130. The system 900 may further include a second MSM element 910 and a second magnetic field generator 920.

The rod 130 may include a first set of protrusions 935, 936 and a second set of protrusions 932, 933. The first set of protrusions 935, 936 may protrude from a first surface of the rod 130 facing the first MSM element 110 and the second set of protrusions 932, 933 may protrude from a second surface of the rod 130 facing the second MSM element 910. Further, as depicted in FIG. 9, the first set of protrusions 935, 936 may be staggered along the rod 130 relative to the second set of protrusions 932, 933. At least one protrusion 935 of the first set of protrusions 935, 936 may be retained by an indentation of the first MSM element 110 and at least one protrusion 933 of the second set of protrusions 932, 933 may be retained by an indentation of the second MSM element 910.

One or more anchors 952 may retain the first MSM element 110 and the second MSM element 910. The anchors may be removed from contact with the rod 130 sufficient to accommodate passage of the protrusions 932, 933, 935, 936, thereby enabling continuous movement of the rod 130 through the system 900.

During operation, the first magnetic field generator 120 may generate and change a magnetic field component (not shown) to move the rod 130 as described herein. Thereafter, the second magnetic field generator 920 may generate the magnetic field component 990. The magnetic field component 990 may cause an indentation in the rod 130 and may receive and retain the protrusion 933 therein. The magnetic field 990 may be changed such that a position of the indentation is moved, thereby moving the rod 130. Thereafter, the first magnetic field generator 120 may generate another magnetic field component 992. The other magnetic field 992 may cause another indentation in the rod 139 capable of receiving and retaining the protrusion 935. The magnetic field component 992 may be changed such that the other indentation is moved, thereby further moving the rod 130. Additional magnetic field components may be generated by both the magnetic field generators 120, 920 in an alternating pattern to form additional indentations on the surface of the MSM element 110. Additional protrusions (e.g., the protrusion 932) may be received at the additional indentations. As such, the rod may be continuously moved by changing positions of the additional indentations in response to continuous changes in the magnetic field components 990, 992.

A benefit of the system 900 is that a rod of arbitrary length may be continuously moved through the system 900 as compared to systems that do not continuously generate and change magnetic field components in an alternating pattern. Other benefits and advantages associated with the system 800 will be apparent to those of skill in the art having the benefit of this disclosure.

Figure 10:
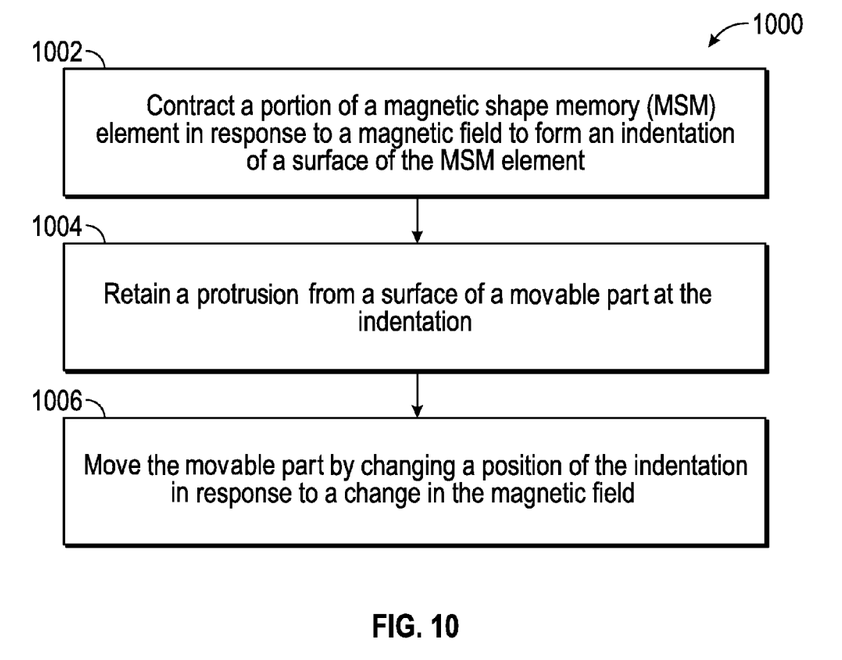
FIG. 10 is a flow chart depicting an embodiment of a method of imparting motion using an MSM element.

Referring to FIG. 10, a flow chart depicting an embodiment of a method 1000 of imparting motion is depicted. The method 1000 may include contracting a portion of an MSM element in response to a magnetic field to form an indentation of a surface of the MSM element, at 1002. For example, referring to FIG. 1, a portion of the MSM element 110 may contract in response to the magnetic field 190 to form the indentation 112.

The method 1000 may further include retaining a protrusion from a surface of a movable part at the indentation, at 1004. For example, the rod 130 may serve as movable part and the protrusion 132 from the surface 134 of the rod 130 may be retained at the indentation 112.

The method 1000 may also include moving the movable part by changing a position of the indentation in response to a change in the magnetic field, at 1006. For example, the rod 130 may be moved by changing a position of the indentation 112 in response to a change in the magnetic field 190.

A benefit of the method 1000 is that by moving the movable part using an MSM element, the movement may be associated with a longer stroke (e.g., a longer reach) as compared to systems that rely on the expansion of the MSM element alone to generate movement. Other benefits and advantages associated with the method 1000 will be apparent to those of skill in the art having the benefit of this disclosure.

One or more of the operations and methods described herein may be initiated at a processor embedded in a computing device. As non-limiting examples, the processor may be, or may include, a central processing unit (CPU), a digital signal processor (DSP), a graphical processing unit (GPU), a peripheral interface controller (PIC), another type of processing unit, or any combinations thereof. The processor may be implemented using semiconductor logic circuitry, a field-programmable gate array (FPGA), an application-specific integrated circuit (ASIC), another type of electrical device or circuit, or any combinations thereof.

A memory, accessible to the processor, may store instructions that, when executed by the processor, cause the processor to perform or initiate one or more of the operations and methods described herein. The memory may include a non-transitory computer readable medium. As a non-limiting example, the memory may be, or may include, a random access memory (RAM), a read-only memory (ROM), another type of memory, or any combinations thereof. The memory may be implemented using a capacitive memory array, a magnetic memory array, a solid state memory array, a magnetic memory device, an optical drive device, a flash memory device, another type of memory device, or any combinations thereof. In some embodiments, the memory may be implemented as removable storage.

Although various embodiments have been shown and described, the present disclosure is not so limited and will be understood to include all such modifications and variations as would be apparent to one skilled in the art having the benefit of this disclosure. Further, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. A motor apparatus comprising:
   a magnetic shape memory (MSM) element;
   a magnetic field generator; and
   a rod in contact with the magnetic shape memory element, the rod including at least one protrusion from a surface of the rod, the protrusion retained by an indentation on a surface of the MSM element.

2. The apparatus of claim 1, wherein the magnetic field generator includes a permanent magnet.

3. The apparatus of claim 1, wherein the magnetic field generator includes a plurality of conductive coils.

4. The apparatus of claim 3, further comprising a magnetic yoke coupled to a first end and a second end of the MSM element and passing through each of the plurality of conductive coils.

5. The apparatus of claim 3, wherein each coil of the plurality of coils wraps around the MSM element and the rod.

6. The apparatus of claim 1, further comprising a guide structure, the guide structure and the MSM element defining a channel that restricts shifting of the rod to one axis.

7. The apparatus of claim 1, further comprising another MSM element, wherein the rod is positioned between the MSM element and the other MSM element.

8. The apparatus of claim 7, wherein the rod includes a first set of protrusions from a first surface of the rod facing the MSM element and a second set of protrusions from a second surface of the rod facing the other MSM element.

9. The apparatus of claim 8, wherein the first set of protrusions is staggered along a longitudinal axis of the MSM element relative to the second set of protrusions.

10. The apparatus of claim 1, further comprising at least one anchor coupled to the MSM element.

11. The apparatus of claim 1, wherein the MSM element comprises nickel, manganese, gallium, or any combinations thereof.

12. A method of imparting motion comprising:
   contracting a portion of a magnetic shape memory (MSM) element in response to a magnetic field to form an indentation on a surface of the MSM element;
   retaining a protrusion from a surface of a movable part at the indentation;
   moving the movable part by changing a position of the indentation in response to a change in the magnetic field.

13. The method of claim 12, wherein the MSM element is configured to contract in response to a magnetic field component that is substantially perpendicular to a longitudinal axis of the MSM element.

14. The method of claim 12, further comprising rotating a permanent magnet to induce the change in the magnetic field.

15. The method of claim 14, wherein the permanent magnet is configured to generate a magnetic field component that is substantially perpendicular to a longitudinal axis of the MSM element, and wherein rotating the permanent magnet repositions the magnetic field component relative to the MSM element.

16. The method of claim 12, further comprising reversing a direction of an electrical current in a conductive coil to induce the change in the magnetic field.

17. The method of claim 16, wherein the magnetic field is generated by a plurality of conductive coils configured to generate a magnetic field component that is substantially perpendicular to a longitudinal axis of the MSM element, and wherein reversing the direction of the electrical current in the conductive coil repositions the magnetic field component relative to the MSM element.

18. The method of claim 12, further comprising guiding the movable part linearly through a channel defined by the MSM element and a guide structure as the movable part is moved.

19. The method of claim 12, further comprising:
   contracting additional portions of the MSM element to form additional indentations on the surface of the MSM in response to additional changes in the magnetic field;

receiving additional protrusions from the surface of the movable part at the additional indentations;

continuously moving the movable part by continuously changing positions of the additional indentations in response to continuous changed in the magnetic field.

20. The method of claim 12, further comprising:

contracting a portion of another MSM element in response to the magnetic field to form an indentation on a surface of another MSM element;

retaining another protrusion from another surface of the movable part at the indentation on the surface of the other MSM element, wherein moving the movable part further includes changing a position of the indentation on the surface of the other MSM element in response to the change in the magnetic field.

* * * * *